US011398279B2

United States Patent
Nie et al.

(10) Patent No.: US 11,398,279 B2
(45) Date of Patent: Jul. 26, 2022

(54) METHOD FOR PROGRAMMING CHARGE TRAP FLASH MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/506,036

(22) Filed: Oct. 20, 2021

(65) Prior Publication Data

US 2022/0122671 A1 Apr. 21, 2022

(30) Foreign Application Priority Data

Oct. 21, 2020 (CN) .......................... 202011131877.6

(51) Int. Cl.
*G11C 16/32* (2006.01)
*G11C 16/14* (2006.01)
*G11C 16/04* (2006.01)
*G11C 16/30* (2006.01)

(52) U.S. Cl.
CPC .......... *G11C 16/14* (2013.01); *G11C 16/0466* (2013.01); *G11C 16/30* (2013.01); *G11C 16/32* (2013.01)

(58) Field of Classification Search
CPC ..... G11C 16/14; G11C 16/0466; G11C 16/30; G11C 16/32
See application file for complete search history.

(56) References Cited

U.S. PATENT DOCUMENTS 6,768,165 B1 * 7/2004 Eitan ................... H01L 29/7923
257/317
7,411,836 B2 8/2008 Kuo et al.
7,447,082 B2 11/2008 Wang et al.
(Continued)

FOREIGN PATENT DOCUMENTS

CN 1619704 A 5/2005
CN 101312072 A 11/2008
(Continued)

*Primary Examiner* — Khamdan N. Alrobaie
(74) *Attorney, Agent, or Firm* — Global IP Services; Tianhua Gu

(57) ABSTRACT

The present disclosure provides a method for programming charge trap flash memory, including: enabling a channel of a charge trap storage component, to form a transverse electric field between a source and a drain, to generate primary electrons flowing from the source to the drain; colliding, by the primary electrons after a preset time, with the drain to generate electron holes; applying voltages to the drain and a substrate, where the electron holes are accelerated downward by the action of the electric field to collide with the substrate, to generate secondary electrons; and applying voltages to a gate and the substrate, to form a vertical electric field, wherein the secondary electrons generate tertiary electrons under the action of the vertical electric field and the tertiary electrons are injected into an insulating storage medium layer of the charge trap storage component, to complete a programming operation.

8 Claims, 4 Drawing Sheets

(56) References Cited

U.S. PATENT DOCUMENTS

| | | | | |
|---|---|---|---|---|
| 2003/0198086 A1* | 10/2003 | Shukuri | ............ | H01L 29/40117 257/E21.679 |
| 2003/0218204 A1* | 11/2003 | Roizin | .............. | H01L 29/40114 438/257 |
| 2006/0035433 A1* | 2/2006 | Jung | ................. | H01L 29/66833 438/257 |
| 2014/0108705 A1* | 4/2014 | Gorobets | ............ | G11C 11/5628 711/103 |
| 2014/0369135 A1* | 12/2014 | Wang | .................... | G11C 16/10 365/185.26 |

FOREIGN PATENT DOCUMENTS

| | | |
|---|---|---|
| CN | 101866693 A | 10/2010 |
| CN | 102411991 A | 4/2012 |
| CN | 102436849 A | 5/2012 |
| CN | 104241396 A | 12/2014 |

* cited by examiner

METHOD FOR PROGRAMMING CHARGE TRAP FLASH MEMORY

CROSS REFERENCE TO RELATED APPLICATION

The present application claims the benefit of priority to Chinese Patent Application No. CN 2020111318776, entitled "METHOD FOR PROGRAMMING CHARGE TRAP FLASH MEMORY", filed with CNIPA on Oct. 21, 2020, the disclosure of which is incorporated herein by reference in its entirety.

FIELD OF TECHNOLOGY

The present disclosure relates to the field of memory, in particular to a method for programming charge trap flash memory.

BACKGROUND

Embedded flash memory (Eflash) is used in common electronic products such as micro control units (MCU), digital signal processors (DSP), application specific integrated circuits (ASIC), programmable logic devices (PLD), and the like. Compared with the conventional EEPROM solution, Eflash has advantages such as its high read and write speed, small area, and low power consumption, and therefore Eflash plays an increasingly important role in scenarios such as the Internet of Things (IOT) and automotive electronics.

Eflash has mainly two types of structures: the conventional floating gate structure and the charge trap structure. Different from the conventional conductive floating gate structure, in the charge trap structure, charges are trapped in an insulating storage medium through a charge trap mechanism. The insulating storage medium is not conductive, and even if there are a few defects in the structure, stored electrons will not escape, so the yield rate of the insulating storage medium is higher than that of flash memory with the floating gate structure under the same circumstances (the floating gate is conductive, so if there are defects, there will be loss of stored electrons and the device will fail).

Compared with Eflash with the floating gate structure, when manufacturing the charge trap structure, only three layers of masks need to be added to a standard logical process platform (seven layers or more layers of masks need to be added for the floating gate structure), which leads to relatively low manufacturing costs, better compatibility with the standard logical process, and simplicity in process, thereby offering charge trap structures a quite obvious cost advantage on the market.

Shortcoming of the charge trap structure include that charges may easily escape from the insulating storage medium at high temperature and high voltage, that it does not have a data retention capability as strong as flash memory with the floating gate structure, and that it is not applicable in high temperature scenarios or scenarios that necessitate high durability. However, in a scenario where the reliability requirement is not high, the charge trap structure may be selected as a low-cost solution.

A conventional charge trap device adopts Channel Hot Electron (CHE) injection or Fowler-Nordheim (FN) Tunneling for programming.

As for CHE injection, a voltage is applied to a control gate of the device. During programming, a voltage is applied to the drain of the device to generate hot electrons; a voltage is also applied to the gate, and then coupling voltage of a top dielectric layer of the device generates an electric potential on the insulating storage medium, helping the electrons overcome an energy barrier, pass through the Tunnel Oxide layer and be injected into the insulating storage medium, thereby completing the programming. Due to the physical mechanism of hot carrier injection (HCI), the generated hot electrons are injected based on the Lucky Electron model, which has relatively low programming efficiency (about 50% generally). Therefore, a higher voltage is needed in order to improve the programming efficiency. But a high voltage may lead to higher power consumption of the device. In addition, the electrons are generally injected from the drain, which inflicts relatively great damage on the Tunnel Oxide layer on the drain side. In the long run, charges are likely to accumulate on the drain side, narrowing the window of a programming voltage Vt, weakening device's endurance, and finally causing reliability issues such as performance degradation of the device.

The programming through FN tunneling can reduce the damage to the Tunnel Oxide layer and is better than HCI in terms of the reliability. However, due to the physical mechanism of FN injection, it has a small programming current, and small read/write currents.

Therefore, it has already become one of the problems that urgently need to be resolved by a person skilled in the art to provide a new method for programming charge trap memory that inflicts small damage on the Tunnel Oxide layer, has high reliability, and has relatively large read and write currents, in order to give full play to the low-cost advantage of the charge trap flash memory.

SUMMARY

The present disclosure provides a method for programming charge trap flash memory, to resolve problems in methods for programming charge trap memory in the prior art such as low efficiency, major damage inflicted on the Tunnel Oxide layer, and small read and write currents.

Thus, the present disclosure provides a method for programming charge trap flash memory. The method for programming charge trap flash memory at least comprises:

S1) providing a charge trap storage component, and enabling a channel of the charge trap storage component, to form a transverse electric field between a source and a drain of the charge trap storage component, the transverse electric field generating primary electrons flowing from the source to the drain;

S2) after a preset time, making the primary electrons collide with the drain to generate electron holes;

S3) applying voltages to the drain and a substrate of the charge trap storage component, wherein the electron holes are accelerated downward by the action of the electric field and collide with the substrate to generate secondary electrons; and S4) applying voltages to a gate and the substrate of the charge trap storage component, to form a vertical electric field, wherein the secondary electrons generate tertiary electrons under the action of the vertical electric field, and the tertiary electrons are injected into an insulating storage medium layer of the charge trap storage component, to complete a programming operation.

Optionally, the charge trap storage component comprises: a silicon oxide nitride oxide silicon (SONOS) component, a polysilicon alumina nitride oxide silicon (SANOS) component, a metal alumina nitride oxide silicon (MANOS) component, or a nitride read only memory (NROM) component.

Optionally, the method for forming the transverse electric field comprises: applying voltages to the source and the drain of the charge trap storage component, where the voltage applied to the source of the charge trap storage component is lower than the voltage applied to the drain of the charge trap storage component.

Optionally, the preset time is from 10 ns to 100 ns.

Optionally, at operation S3), the voltage applied to the substrate of the charge trap storage component is lower than the voltage applied to the drain, and the voltage difference is not lower than 5 V.

Optionally, at operation S4), the voltage applied to the substrate of the charge trap storage component is lower than the voltage applied to the gate.

Optionally, before operation S1), the method further comprises pre-erasing the charge trap storage component to eliminate residual charges in the insulating storage medium layer.

Further optionally, the pre-erasing is implemented by: applying voltages to the gate and the drain of the charge trap storage component, to create a band-to-band tunneling (BTBT) condition and generate electron holes, wherein the electron holes are injected into the insulating storage medium layer to neutralize residual electrons in the insulating storage medium layer.

Further optionally, the voltage applied to the drain of the charge trap storage component is higher than the voltage applied to the gate.

As described above, the method for programming charge trap flash memory according to the present disclosure has the following beneficial effects:

In the method for programming charge trap flash memory according to the present disclosure, during programming, tertiary electrons are generated by a transverse electric field and a vertical electric field, which can effectively increase read and write currents of a charge trap storage component, reduce the power consumption, and improve the device reliability, which, together with the low-cost advantage of the charge trap storage component, offers a promising future for the charge trap flash memory.

REFERENCE NUMERALS

Figure 1:
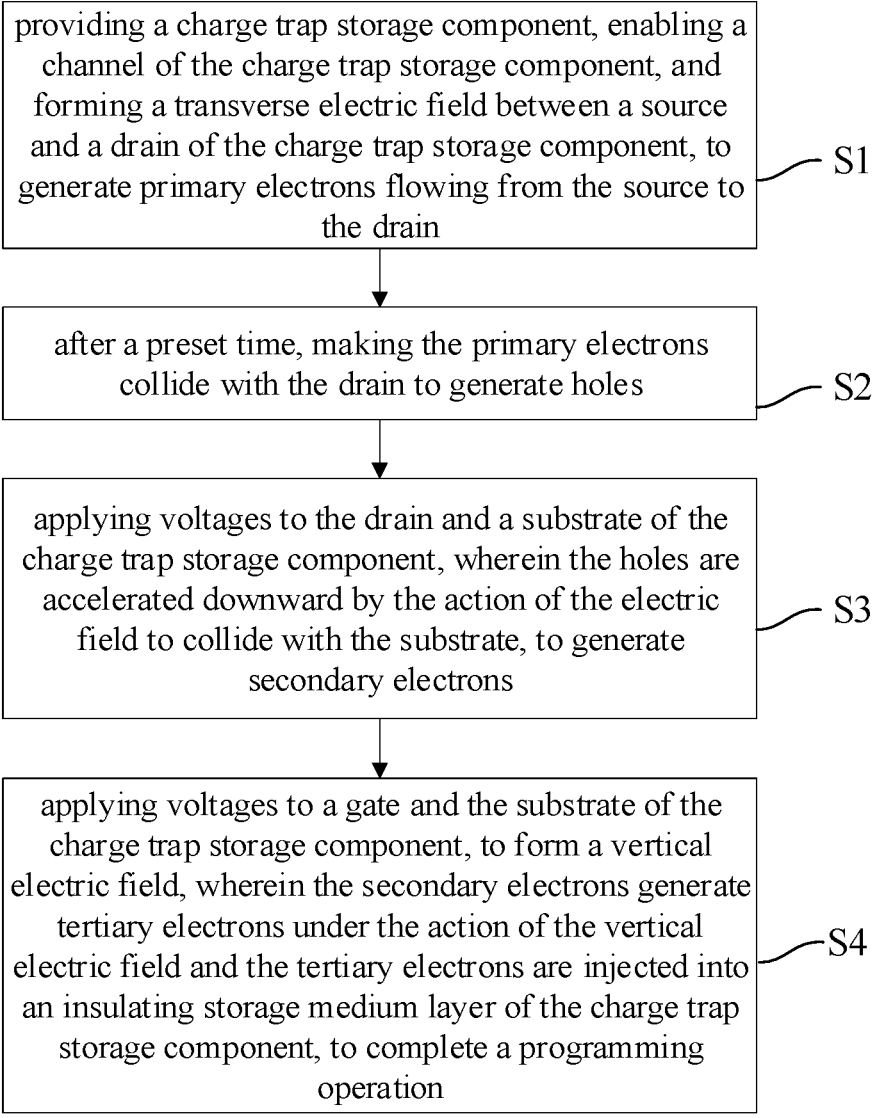
FIG. 1 is a schematic flowchart of a method for programming charge trap flash memory according to the present disclosure.

1 Substrate
2 Source region
3 Drain region
4 Tunnel oxide layer
5 Silicon nitride layer
6 High-temperature oxide layer
7 Polysilicon layer
8 Self-aligned metal silicide layer
S1 to S4 Various Operations

DETAILED DESCRIPTION

The following describes implementations of the present disclosure using specific embodiments. A person skilled in the art may easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 7. It should be noted that the drawings provided in this embodiment only exemplify the basic idea of the present disclosure. Therefore, only the components related to the present disclosure are shown in the drawings, and are not drawn according to the quantities, shapes, and sizes of the components during actual implementation. During actual implementation, the types, quantities, and proportions of the components may be randomly changed, and the layout pattern of the components may be more complicated.

As shown in FIG. 1 to FIG. 7, the present disclosure provides a method for programming charge trap flash memory, and the method for programming charge trap flash memory comprises the following operations:

Operation S1) Provide a charge trap storage component, enable a channel of the charge trap storage component, form a transverse electric field between a source and a drain of the charge trap storage component, in order to generate primary electrons flowing from the source to the drain.

Specifically, a charge trap storage component is provided. The charge trap storage component includes, but is not limited to, a SONOS component, a SANOS component, a MANOS component, or an NROM component. The MANOS component further includes a tantalum nitride oxide silicon (TANOS) component and other MANOS components according to different metal materials, the NROM component is an improved structure of the SONOS component, and the SONOS component is a charge trap storage component that is most commonly used. Any charge trap storage component structure comprising an insulating storage medium layer is applicable to the present disclosure, and details are not described herein.

Figure 2:
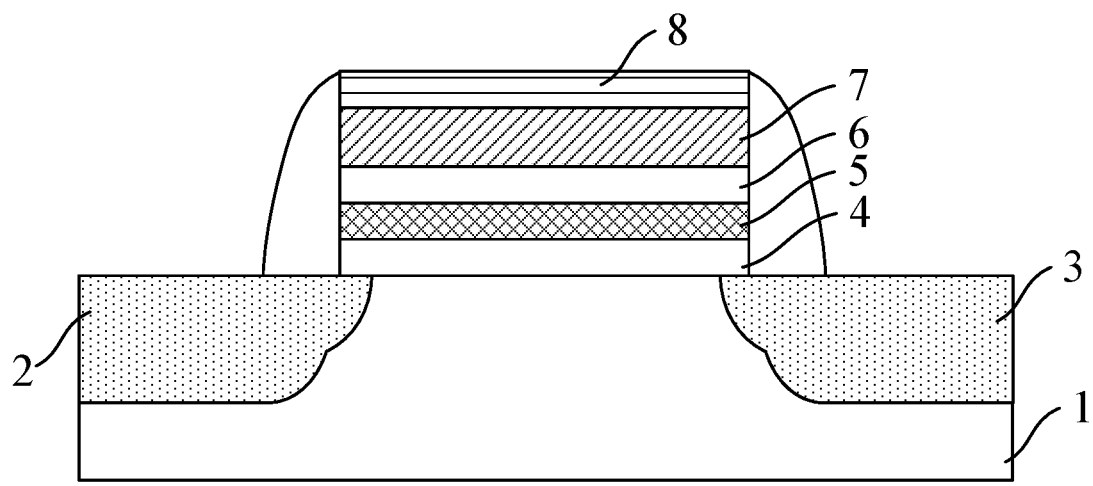
FIG. 2 is a schematic structural diagram of a SONOS component according to the present disclosure.

For example, as shown in FIG. 2, the charge trap storage component may be a SONOS component, and the SONOS component comprises a substrate 1, a source region 2, and a drain region 3 formed in the substrate 1. Further, a Tunnel Oxide layer 4, a SiN layer 5, a high-temperature oxide (HTO) layer 6, a polysilicon (Poly) layer 7, and a self-aligned metal silicide (salicide, used as a control gate) layer 8 may be sequentially formed above the substrate 1. In this embodiment, the substrate 1 may be a P-type substrate, and the source region 2 and the drain region 3 may be N-type doped regions. During actual use, the structure and material(s) of the SONOS component may be adjusted as required, without limitation.

Figure 5:
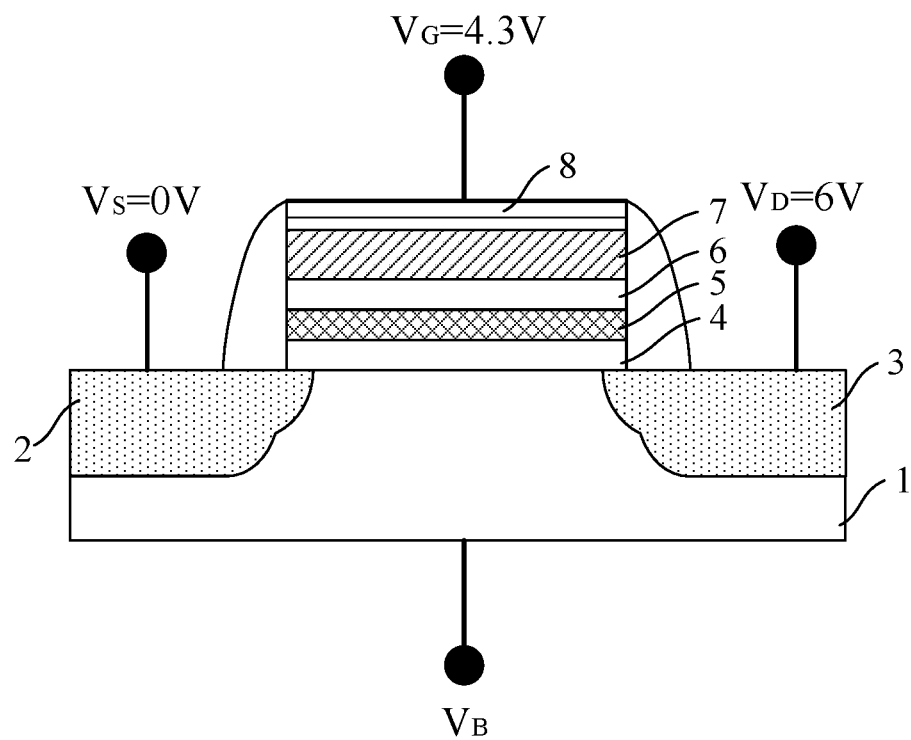
FIG. 5 is a schematic diagram illustrating the operation of forming a transverse electric field in a method for programming charge trap flash memory according to the present disclosure.

Specifically, as shown in FIG. 5, in this embodiment, voltages $V_G$, $V_S$, and $V_D$ are respectively applied to a gate, a source, and a drain of the SONOS component, in order to enable a channel of the SONOS component and form a transverse electric field between the source and the drain of the SONOS component, and in order to generate primary electrons flowing from the source to the drain. In this embodiment, the voltage $V_G$ applied to the gate of the SONOS component may be a positive voltage, which turns on the SONOS component. For example, the voltage $V_G$ applied to the gate may be about 4.3 V (or higher than 4.3 V, which includes, but is not limited to 5 V, 5.5 V, 6 V, or 7 V). During actual use, any voltage that can turn on the SONOS component may be applied to the gate of the SONOS component, which is not limited to this embodiment.

The voltage $V_S$ applied to the source of the SONOS component is lower than the voltage $V_D$ applied to the drain of the SONOS component, in order to form the transverse electric field. In this embodiment, the voltage $V_S$ applied to the source of the SONOS component may be about 0 V, and the voltage $V_D$ applied to the drain may be about 6 V. For example, the difference between the voltage $V_S$ applied to the source and the voltage $V_D$ applied to the drain is not lower than 5 V, the difference between the voltage $V_S$ applied to the source and the voltage $V_D$ applied to the drain and specific voltage values thereof may be set according to actual device parameters, and details are not described herein.

In another implementation of the present disclosure, before operation S1) is performed, the method further comprises pre-erasing the charge trap storage component to eliminate residual charges in an insulating storage medium of the charge trap storage component.

Figure 3:
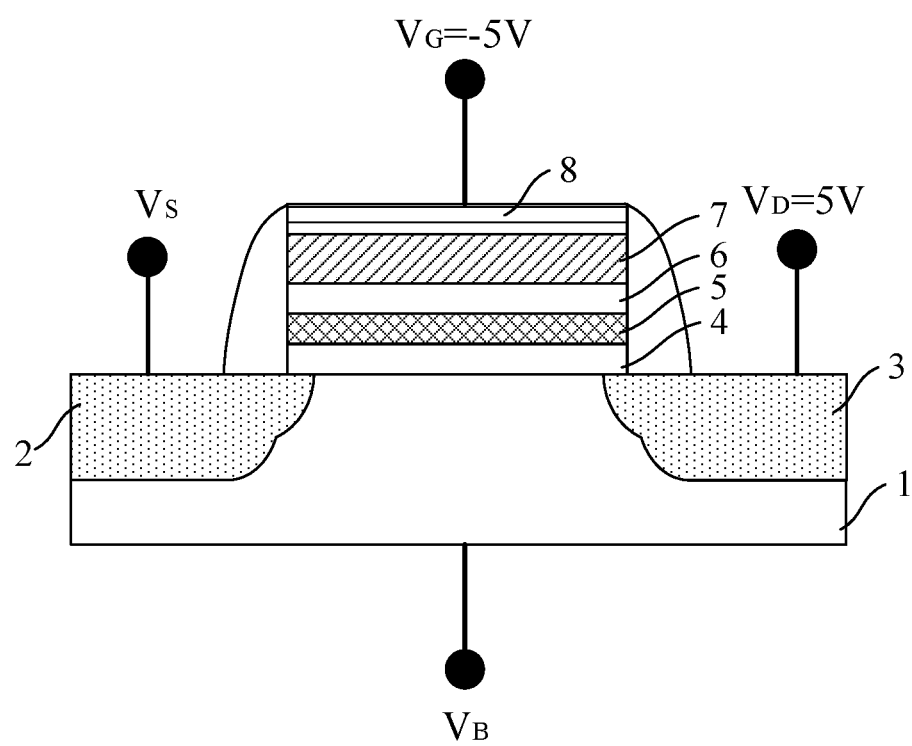
FIG. 3 is a schematic diagram illustrating the operation of pre-erasure in a method for programming charge trap flash memory according to the present disclosure.
Figure 4:
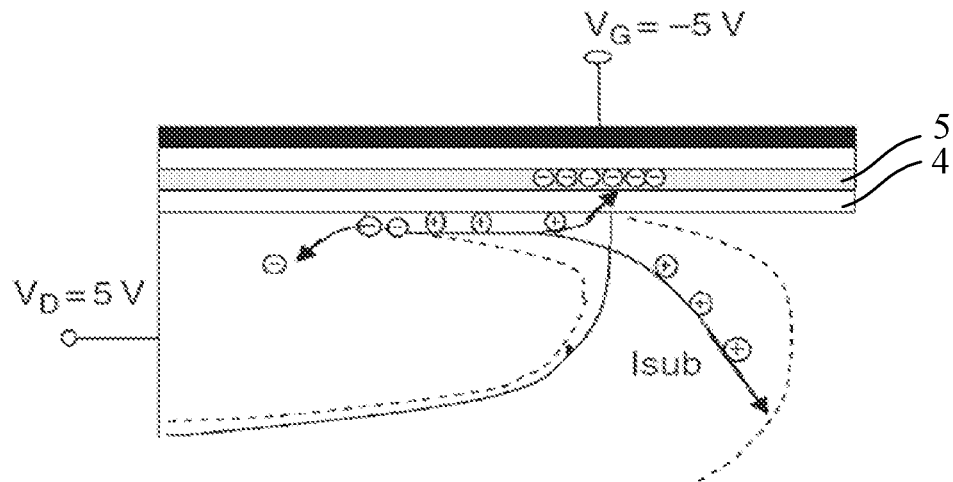
FIG. 4 is a schematic diagram of a principle of pre-erasure in a method for programming charge trap flash memory according to the present disclosure.

As shown in FIG. 3 and FIG. 4, voltages are applied to the gate and the drain of the SONOS component, to reach a BTBT condition and generate electron holes, where the electron holes are injected into the SiN layer 5 (an insulating storage medium layer) to neutralize residual electrons in the SiN layer 5. The voltage $V_D$ applied to the drain of the SONOS component may be higher than the voltage $V_G$ applied to the gate. For example, the voltage $V_G$ applied to the gate of the SONOS component may be about −5 V, and the voltage $V_D$ applied to the drain of the SONOS component may be about 5 V, in order to reach a BTBT condition to generate the electron holes to neutralize the residual electrons in the SiN layer 5. During actual use, the voltage $V_G$ applied to the gate and the voltage $V_D$ applied to the drain may be set based on parameters such as the dimensions and material(s) of the SONOS component.

Operation S2) After a preset time, make the primary electrons collide with the drain to generate electron holes.

Specifically, for example, the preset time may be from 10 ns to 100 ns. During actual use, the preset time may be adjusted based on factors such as the electric field, as long as the primary electrons is able to collide with the drain to generate the electron holes, which is not limited to this embodiment.

Operation S3) Apply voltages to the drain and a substrate of the charge trap storage component, wherein the electron holes are accelerated downward by the action of the electric field to collide with the substrate, to generate secondary electrons.

Figure 6:
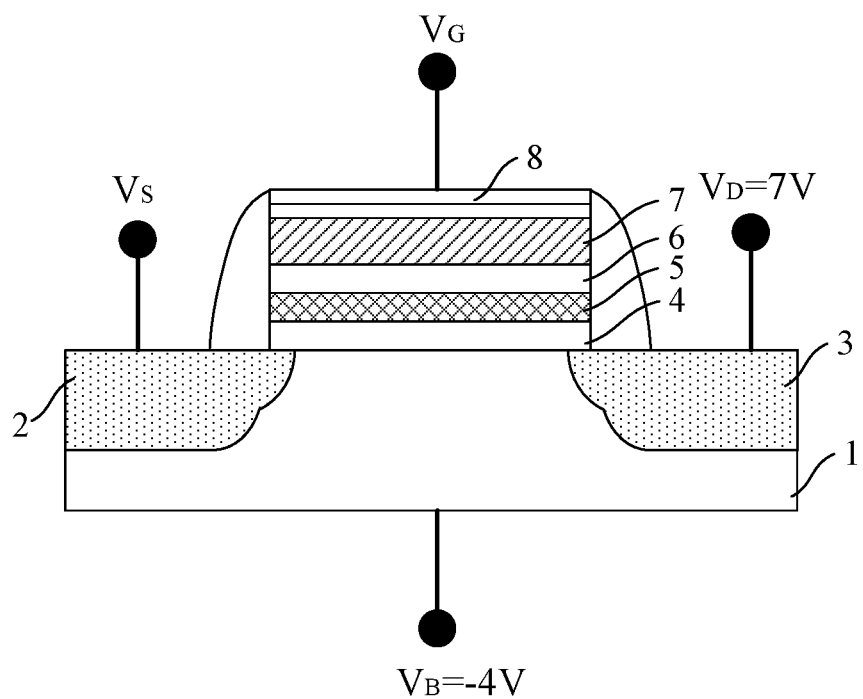
FIG. 6 is a schematic diagram illustrating the operation of generating secondary electrons in a method for programming charge trap flash memory according to the present disclosure.

Specifically, as shown in FIG. 6, in this embodiment, voltages are respectively applied to the drain and a substrate of the SONOS component, and the voltage $V_B$ applied to the substrate of the SONOS component may be lower than the voltage $V_D$ applied to the drain, provided that the difference between the voltage $V_B$ applied to the substrate and the voltage $V_D$ applied to the drain can enable relatively heavy electron holes to accelerate to collide with the substrate to generate relatively light electrons.

For example, the difference between the voltage $V_B$ applied to the substrate and the voltage $V_D$ applied to the drain may not be lower than about 5 V, 9 V, or 10 V, details of which are not described herein. In this embodiment, the voltage $V_B$ applied to the substrate may be about −4 V, and the voltage $V_D$ applied to the drain may be about 7 V. For simplicity of operation, the voltage $V_D$ applied to the drain may continue to have the voltage value in the previous operation (i.e., about 6 V), and only the value of the voltage $V_B$ applied to the substrate is adjusted. The specific voltage values may be set as required, and are not limited to this embodiment.

Operation S4) Apply voltages to a gate and the substrate of the charge trap storage component, to form a vertical electric field, wherein the secondary electrons generate tertiary electrons under the action of the vertical electric field and the tertiary electrons are injected into an insulating storage medium layer of the charge trap storage component, to complete a programming operation.

Figure 7:
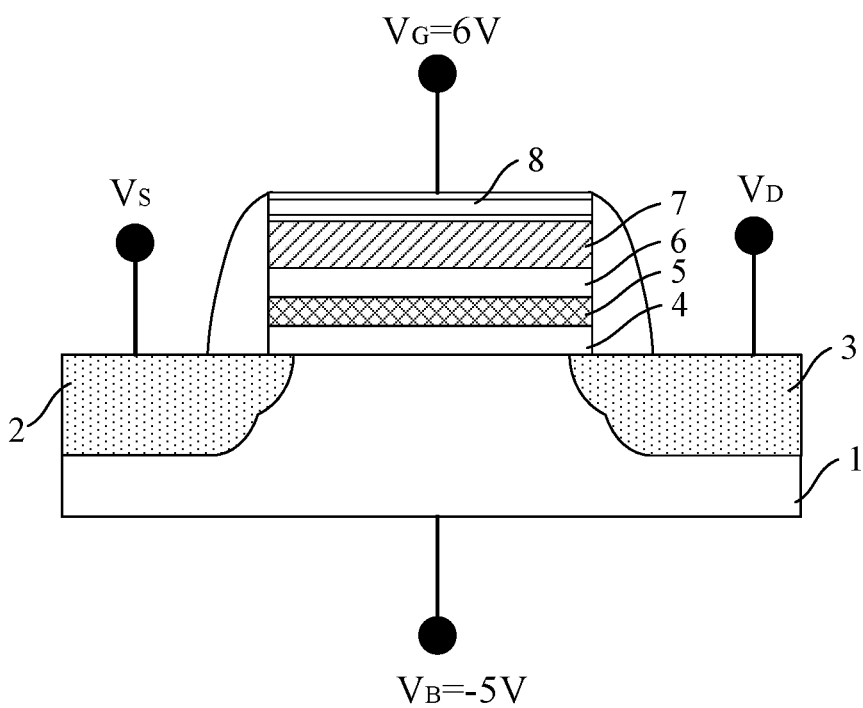
FIG. 7 is a schematic diagram illustrating the operation of injecting tertiary electrons into a silicon nitride (SiN) layer in a method for programming charge trap flash memory according to the present disclosure.

Specifically, as shown in FIG. 7, in this embodiment, voltages are respectively applied to a gate and the substrate of the SONOS component to form a vertical electric field, and the voltage $V_B$ applied to the substrate of the SONOS component is lower than the voltage $V_G$ applied to the gate, provided that the difference between the voltage $V_B$ applied to the substrate and the voltage $V_G$ applied to the gate can transform the secondary electrons into tertiary electrons and inject the tertiary electrons into the SiN layer 5 of the SONOS component through the Tunnel Oxide layer 4.

For example, the difference between the voltage $V_B$ applied to the substrate and the voltage $V_G$ applied to the gate may not be lower than about 9 V, 10 V, or 12 V, the details of which are not described herein. In this embodiment, the voltage $V_B$ applied to the substrate may be about −5 V, and the voltage $V_G$ applied to the gate may be about 6 V. For simplicity of operation, the voltage $V_B$ applied to the substrate may continue to have the voltage value (about −4 V) in the previous operation, and only the value of the voltage $V_G$ applied to the gate is adjusted. The specific voltage values may be set as required, and are not limited to this embodiment.

In the method for programming charge trap flash memory according to the present disclosure, programming is performed based on tertiary electron excitation. During programming, both a transverse electric field and a vertical electric field are utilized, in order to greatly improve the programming efficiency and reduce the power consumption. In addition, the read and write currents during programming may be high, damage to the Tunnel Oxide layer may be small, and the device reliability may be greatly improved, which, together with the low-cost advantage of the charge trap storage component, offers a promising future for the charge trap flash memory.

In summary, the present disclosure provides a method for programming charge trap flash memory, comprising: providing a charge trap storage component, and enabling a channel of the charge trap storage component, forming a transverse electric field between a source and a drain of the charge trap storage component, to generate primary electrons flowing from the source to the drain; colliding, by the primary electrons after a preset time, with the drain to generate electron holes; applying voltages to the drain and a substrate of the charge trap storage component, where the electron holes are accelerated downward by the action of the electric field to collide with the substrate, to generate secondary electrons; and applying voltages to a gate and the substrate of the charge trap storage component, to form a vertical electric field, where the secondary electrons form tertiary electrons under the action of the vertical electric field and the tertiary electrons are injected into an insulating storage medium layer of the charge trap storage component, to complete a programming operation.

In the method for programming charge trap flash memory according to the present disclosure, during programming, tertiary electrons are generated by using a transverse electric field and a vertical electric field, which can effectively increase the read and write currents of a charge trap storage component, reduce the power consumption, and improve the device reliability, which, together with the low-cost advantage of the charge trap storage component, offers a promising future for the charge trap flash memory. Therefore, the present disclosure effectively overcomes various shortcomings in the prior art, and has a high industrial value.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method for programming charge trap flash memory, comprising:
    S1) providing a charge trap storage component, enabling a channel of the charge trap storage component, and forming a transverse electric field between a source and a drain of the charge trap storage component, to generate primary electrons flowing from the source to the drain;
    S2) after a preset time, making the primary electrons collide with the drain to generate electron holes;
    S3) applying voltages to the drain and a substrate of the charge trap storage component, wherein the electron holes are accelerated downward by the action of the electric field to collide with the substrate, to generate secondary electrons; wherein the voltage applied to the substrate of the charge trap storage component is lower than the voltage applied to the drain, and the voltage difference is not lower than 5 V; and
    S4) applying voltages to a gate and the substrate of the charge trap storage component, to form a vertical electric field, wherein the secondary electrons generate tertiary electrons under the action of the vertical electric field and the tertiary electrons are injected into an insulating storage medium layer of the charge trap storage component, to complete a programming operation.

2. The method for programming charge trap flash memory as in claim 1, wherein the charge trap storage component comprises:
    a silicon oxide nitride oxide silicon (SONOS) component,
    a polysilicon alumina nitride oxide silicon (SANOS) component,
    a metal alumina nitride oxide silicon (MANOS) component, or
    a nitride read only memory (NROM) component.

3. The method for programming charge trap flash memory as in claim 1, wherein the forming the transverse electric field comprises:
    applying voltages to the source and the drain of the charge trap storage component, wherein the voltage applied to the source of the charge trap storage component is lower than the voltage applied to the drain of the charge trap storage component.

4. The method for programming charge trap flash memory as in claim 1, wherein
    the preset time is from 10 ns to 100 ns.

5. The method for programming charge trap flash memory as in claim 1, wherein
    at operation S4), the voltage applied to the substrate of the charge trap storage component is lower than the voltage applied to the gate.

6. The method for programming charge trap flash memory as in claim 1, wherein before the operation S1), the method further comprises
    pre-erasing the charge trap storage component to eliminate residual charges in the insulating storage medium layer.

7. The method for programming charge trap flash memory as in claim 6, wherein the pre-erasing is implemented by:
    applying voltages to the gate and the drain of the charge trap storage component, to reach a band-to-band tunneling (BTBT) condition and generate second electron holes, wherein the second electron holes are injected into the insulating storage medium layer to neutralize residual electrons in the insulating storage medium layer.

8. The method for programming charge trap flash memory as in claim 7, wherein
    the voltage applied to the drain of the charge trap storage component is higher than the voltage applied to the gate.

* * * * *